United States Patent
Tada

(10) Patent No.: US 10,759,969 B2
(45) Date of Patent: Sep. 1, 2020

(54) POLISHING COMPOSITION, POLISHING METHOD, AND METHOD FOR MANUFACTURING SEMICONDUCTOR SUBSTRATE

(71) Applicant: FUJIMI INCORPORATED, Kiyosu-shi, Aichi (JP)

(72) Inventor: Masaki Tada, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 16/084,724

(22) PCT Filed: Mar. 6, 2017

(86) PCT No.: PCT/JP2017/008825
§ 371 (c)(1),
(2) Date: Sep. 13, 2018

(87) PCT Pub. No.: WO2017/163847
PCT Pub. Date: Sep. 28, 2017

(65) Prior Publication Data
US 2019/0071588 A1 Mar. 7, 2019

(30) Foreign Application Priority Data
Mar. 25, 2016 (JP) .................. 2016-061571

(51) Int. Cl.
*C09G 1/02* (2006.01)
*C09K 3/14* (2006.01)
*H01L 21/306* (2006.01)

(52) U.S. Cl.
CPC .............. *C09G 1/02* (2013.01); *C09K 3/1436* (2013.01); *H01L 21/30625* (2013.01)

(58) Field of Classification Search
None
See application file for complete search history.

(56) References Cited

U.S. PATENT DOCUMENTS

| | | | |
|---|---|---|---|
| 4,944,836 A | 7/1990 | Beyer et al. | |
| 2005/0233680 A1* | 10/2005 | Fang | C09G 1/02 451/41 |
| 2008/0032505 A1* | 2/2008 | Kawamura | C09G 1/02 438/692 |
| 2009/0239380 A1* | 9/2009 | Tomiga | C09G 1/02 438/693 |
| 2010/0187540 A1 | 7/2010 | Ishibashi et al. | |
| 2012/0115768 A1* | 5/2012 | Miyake | C11D 1/72 510/337 |
| 2014/0342561 A1* | 11/2014 | Yokota | B24B 37/044 438/693 |
| 2015/0175845 A1 | 6/2015 | Li et al. | |
| 2016/0009955 A1 | 1/2016 | Lan et al. | |

FOREIGN PATENT DOCUMENTS

| | | |
|---|---|---|
| JP | 2013-115155 A | 6/2013 |
| JP | 2015-523716 A | 8/2015 |
| WO | WO 2008/047627 A1 | 4/2008 |
| WO | WO 2014/184709 A2 | 11/2014 |

\* cited by examiner

*Primary Examiner* — Roberts P Culbert
(74) *Attorney, Agent, or Firm* — Foley & Lardner LLP

(57) ABSTRACT

The present invention provides a polishing composition which is suitable for polishing an object to be polished having a layer containing a Group III-V compound, suppresses etching of the Group III-V compound, and is capable of polishing at a high polishing speed. The polishing composition according to the present invention is a polishing composition used for polishing an object to be polished having a layer containing a Group III-V compound and contains abrasive grains, an oxidizer, and an anionic surfactant.

9 Claims, No Drawings

POLISHING COMPOSITION, POLISHING METHOD, AND METHOD FOR MANUFACTURING SEMICONDUCTOR SUBSTRATE

TECHNICAL FIELD

The present invention relates to a polishing composition, and a polishing method and a method for manufacturing a semiconductor substrate using the polishing composition.

BACKGROUND ART

In recent years, new microprocessing technologies have been developed along with high-level integration and performance enhancement of LSI. A chemical mechanical polishing (hereinafter, also simply referred to as CMP) method is one of such technologies, and is a technology that is frequently utilized for the flattening of an interlayer insulating film, formation of a metal plug, and formation of embedded wiring (damascene wiring) in an LSI production process, particularly, in a multilayer wiring forming process. This technology is disclosed in, for example, U.S. Pat. No. 4,944,836. With a damascene wiring technology, the wiring process can be simplified and the product yield and reliability can be enhanced.

Further, as one of technologies for reducing power consumption or enhancing performance (operation characteristics) in a transistor, an investigation has been conducted on channels which use a high mobility material that exhibits higher mobility of carriers than that of Si (hereinafter, also simply referred to as "high mobility material"). In channels that have been produced using such a high mobility material and thus have improved transport characteristics of carriers, a drain current can be increased in an On-state. Therefore, a source voltage can be decreased while a sufficient on-current is obtained. This combination brings about superior performance of a metal oxide semiconductor field-effect transistor (MOSFET) at low electric power.

Application of Group III-V compounds, Group IV compounds, germanium (Ge), graphene composed only of carbon (C), and the like as the high mobility material has been anticipated. In particular, application of Group III-V compounds and the like has been positively considered.

Channels that use a high mobility material can be formed by polishing an object to be polished having a portion containing a high mobility material (hereinafter, also referred to as the high mobility material portion) and a portion containing a silicon material (hereinafter, also referred to as the silicon material portion). In this case, it is required to achieve processing of the high mobility material portion into a smooth surface by polishing the portion at a high polishing speed, as well as suppression of the generation of a level difference caused by etching, on the surface after polishing of the object to be polished. For example, JP 2015-523716 W (corresponding to US 2015/175,845 A) discloses a method for manufacturing semiconductor devices in which a III-V material is chemical-mechanically polished.

SUMMARY OF INVENTION

However, in the manufacturing method described in JP 2015-523716 W (corresponding to US 2015/175,845 A), there is a problem in that excessive dissolution (etching) of the III-V material progresses so that recesses are generated.

In this regard, an object of the present invention is to provide a polishing composition which is suitable for polishing an object to be polished having a layer containing a Group III-V compound, suppresses etching of the Group III-V compound, and is capable of polishing at a high polishing speed.

The present inventor has repeatedly conducted intensive studies in order to solve the above-described problem. As a result, the present inventor has found out that the above-described problem can be solved by a polishing composition containing abrasive grains, an oxidizer, and an anionic surfactant, thereby completing the present invention.

DESCRIPTION OF EMBODIMENTS

The present invention is a polishing composition used for polishing an object to be polished having a layer containing a Group III-V compound and contains abrasive grains, an oxidizer, and an anionic surfactant. The polishing composition according to the present invention is suitable for polishing an object to be polished having a layer containing a Group III-V compound, suppresses etching of the Group III-V compound, and is capable of polishing at a high polishing speed.

In a case where the object to be polished having a layer containing a Group III-V compound is processed by the polishing composition of the present invention, first, an oxide film is formed on the surface of the layer containing a Group III-V compound by the action of the oxidizer. Since the surface of the oxide film thus formed is hydrophilic, the hydrophilic group of the anionic surfactant is rapidly adsorbed on the surface. On the other hand, the hydrophobic group of the anionic surfactant self-arranges by intermolecular interaction. That is, a hydrophobic film is formed on the oxide film. The hydrophobic film functions as a barrier of the oxide film and inhibits the contact of the oxidizer or water with the oxide film, and thus etching of the Group III-V compound is suppressed. Further, since the oxide film protected by the hydrophobic film is brittle, the oxide film is easily removed by the abrasive grains (that is, is polished at a high polishing speed). Therefore, the polishing composition according to the present invention can efficiently polish the object to be polished having a layer containing a Group III-V compound. In addition, the object to be polished having a layer containing a Group III-V compound can be polished at high selectivity with almost no recess being generated. Herein, the term "high selectivity" means that the polishing speed of the Group III-V compound portion is higher than the polishing speed of the other portion (for example, the silicon material portion) in the object to be polished.

Incidentally, the above-described mechanism is only based on speculation, and the present invention is not intended to be limited to the above-described mechanism.

In this specification, unless particularly stated otherwise, operations and measurement of physical properties and the like are carried out under the conditions of room temperature (20 to 25° C.)/relative humidity of 40 to 50% RH.

[Object to be Polished]

The polishing composition according to the present invention is used for polishing an object to be polished having a layer containing a Group III-V compound. Moreover, the polishing composition is used for polishing the object to be polished to manufacture a substrate (for example, a semiconductor substrate).

The Group III-V compound is preferably at least one kind selected from the group consisting of GaAs, InP, InAs, AlAs, InGaAs, InGaAsP, AlGaAs, and InAlGaAs, and is more preferably GaAs.

The object to be polished according to the present invention may have a layer containing a silicon material portion. Examples of the silicon material include a simple silicon substance and a silicon compound. Further, examples of the simple silicon substance include single crystal silicon, polycrystalline silicon (polysilicon), and amorphous silicon. Examples of the silicon compound include silicon nitride (SiN), silicon oxide, silicon carbide, and tetraethyl orthosilicate (TEOS). Examples of the layer containing a silicon material also include a low permittivity film having a relative permittivity of 3 or less.

Among these silicon materials, single crystal silicon, polycrystalline silicon, silicon nitride, silicon oxide, and tetraethyl orthosilicate are preferable.

Next, constituents of the polishing composition of the present invention will be described in detail.

[Anionic Surfactant]

The anionic surfactant contained in the polishing composition of the present invention contains a hydrophobic group, and a hydrophilic group which dissociates in water to produce an anion, and suppresses etching of the Group III-V compound.

The anionic surfactant of the present invention preferably contains, as a hydrophilic group, a group selected from the group consisting of a phosphoric group or a group of a salt thereof, a carboxyl group or a group of a salt thereof, and a sulfonic group or a group of a salt thereof. Of them, the anionic surfactant preferably contains at least one of a phosphoric group or a group of a salt thereof and a carboxyl group or a group of a salt thereof. In a case where an anionic surfactant containing such a group is blended in the polishing composition, even when the polishing treatment at a high temperature (40° C. or higher) is performed, it is possible to suppress etching of the Group III-V compound.

The anionic surfactant preferably contains, as a hydrophobic group, at least one of a substituted or non-substituted alkyl group having a carbon number of 5 or more and 30 or less and a substituted or non-substituted aryl group having a carbon number of 6 or more and 50 or less. According to this, the hydrophobic group of the anionic surfactant adsorbed on the oxide film of the Group III-V compound self-arranges by intermolecular interaction (hydrophobic interaction, π-π interaction, or the like) and the formation of the hydrophobic film on the oxide film is promoted. Thus, the hydrophobic film becomes a barrier so as to inhibit the contact of the oxidizer or water with the oxide film, and thus dissolution of the oxide film, that is, etching of the Group III-V compound can be suppressed.

Examples of the non-substituted alkyl group having a carbon number of 5 or more and 30 or less include a pentyl group, an isopentyl group, a 2-methylbutyl group, a 1-methylbutyl group, a hexyl group, an isohexyl group, a 3-methylpentyl group, a 2-methylpentyl group, a 1-methylpentyl group, a heptyl group, an octyl group, an isooctyl group, a 2-ethylhexyl group, a 3,7-dimethyloctyl group, a nonyl group, a decyl group, an undecyl group, a dodecyl group, a tridecyl group, a tetradecyl group, a pentadecyl group, a hexadecyl group, an octadecyl group, and an eicosyl group. In particular, the carbon number of the alkyl group is preferably 8 or more and 25 or less, more preferably 10 or more and 20 or less, and further preferably 12 or more and 15 or less, from the viewpoint of dispersibility in the polishing composition and the film-dense property of the hydrophobic film. Further, from the viewpoint of the film-dense property of the hydrophobic film, the alkyl group is preferably linear.

Examples of the non-substituted aryl group having a carbon number of 6 or more and 50 or less include a phenyl group and a naphthyl group. In particular, the carbon number of the aryl group is preferably 6 or more and 40 or less, more preferably 6 or more and 30 or less, and further preferably 6 or more and 20 or less, and a phenyl group is particularly preferable, from the viewpoint of dispersibility in the polishing composition and the film-dense property of the hydrophobic film. A substituent that may be present in the aryl group is not particularly limited, and is preferably a benzylalkyl group (—R—$C_6H_5$, R represents an alkylene group having a carbon number of 1 or more and 4 or less), more preferably a benzylalkyl group having a branched chain, and further preferably an α-methylbenzyl group (—CH($CH_3$)—$C_6H_5$).

From the viewpoint of improving the polishing speed while etching is suppressed, the anionic surfactant of the present invention preferably contains a polyoxyalkylene group. The polyoxyalkylene group is a group represented by -(AO)$_n$—. At this time, the A is preferably a substituted or non-substituted alkylene group having a carbon number of 2 or more and 4 or less, and from the viewpoint of further improving the polishing speed, is more preferably a substituted or non-substituted ethylene group. In addition, the n represents an average addition mole number of the oxyalkylene group and is preferably 1 or more and 50 or less, more preferably 1 or more and 30 or less, further preferably 1 or more and 20 or less, and particularly preferably 1 or more and 10 or less. Therefore, in a preferred embodiment of the present invention, the polyoxyalkylene group is a group represented by -(AO)$_n$—, and at this time, the A is a substituted or non-substituted alkylene group having a carbon number of 2 or more and 4 or less, and the n represents an average addition mole number of the oxyalkylene group and is 1 or more and 50 or less. In particular, from the viewpoint of further improving the polishing speed and further suppressing etching of the Group III-V compound in the polishing treatment at a high temperature (40° C. or higher), the n is preferably 2 or more and 10 or less, more preferably 2 or more and 7 or less, further preferably 2 or more and 5 or less, and particularly preferably 2 or more and 3 or less. Therefore, in a preferred embodiment of the present invention, the A is a substituted or non-substituted ethylene group and the n is 2 or more and 10 or less.

Examples of the anionic surfactant containing a carboxyl group or a group of a salt thereof include lauric acid, polyoxyethylene lauryl ether acetic acid, polyoxyethylene tridecyl ether acetic acid, polyoxyethylene octyl ether acetic acid, sodium polyoxyethylene lauryl ether acetate, ammonium polyoxyethylene lauryl ether acetate, sodium polyoxyethylene tridecyl ether acetate, ammonium polyoxyethylene tridecyl ether acetate, sodium polyoxyethylene octyl ether acetate, ammonium polyoxyethylene octyl ether acetate, and potassium laurate. Among these, polyoxyethylene lauryl ether acetic acid or potassium laurate is preferable. These may be used singly or in combination of two or more kinds thereof.

Examples of the anionic surfactant containing a phosphoric group or a group of a salt thereof include lauryl phosphate, polyoxyethylene lauryl ether phosphoric acid, polyoxyethylene alkyl ether phosphoric acid, dipolyoxyethylene alkyl ether phosphoric acid, sodium polyoxyethylene lauryl ether phosphate, sodium polyoxyethylene oleyl ether phosphate, sodium polyoxyethylene cetyl ether phosphate, potassium polyoxyethylene alkyl ether phosphate, and a polyoxyethylene aryl phenyl ether phosphate triethanolamine salt. Among these, lauryl phosphate, polyoxyethylene alkyl ether phosphoric acid, dipolyoxyethylene alkyl ether phosphoric acid, or a polyoxyethylene aryl phenyl ether phosphate triethanolamine salt is preferable. These may be used singly or in combination of two or more kinds thereof.

Examples of the anionic surfactant containing a sulfonic group or a group of a salt thereof include polyoxyethylene octyl sulfonic acid, polyoxyethylene dodecyl sulfonic acid, polyoxyethylene cetyl sulfonic acid, polyoxyethylene octylbenzene sulfonic acid, and polyoxyethylene dodecylbenzene sulfonic acid; and sodium polyoxyethylene octyl sulfonate, sodium polyoxyethylene dodecyl sulfonate, sodium polyoxyethylene cetyl sulfonate, dodecyl diphenyl ether disulfonic acid, sodium dodecyl diphenyl ether disulfonate, dodecylbenzene sulfonic acid, and sodium dodecylbenzene sulfonate. Among these, sodium dodecyl diphenyl ether disulfonate or dodecylbenzene sulfonic acid is preferable. These may be used singly or in combination of two or more kinds thereof.

As the anionic surfactant, a commercially available product or a synthetic product may be used.

The upper limit of the content of the anionic surfactant in the polishing composition is 2000 ppm or less, more preferably 1000 ppm or less, more preferably 500 ppm or less, and particularly preferably 300 ppm or less, with respect to the mass of the whole composition. With such a range, it is possible to favorably achieve a balance between suppression of etching of the Group III-V compound and improvement in the polishing speed. In addition, the lower limit of the content of the anionic surfactant in the polishing composition is preferably 10 ppm or more, more preferably 50 ppm or more, and further preferably 100 ppm or more, with respect to the mass of the whole composition. With such a range, the adsorption density of the anionic surfactant on the oxide film is high and thus a dense hydrophobic film is formed. Therefore, etching of the Group III-V compound can be suppressed.

The upper limit of the content of the anionic surfactant in the polishing composition is preferably 300 parts by mass or less, more preferably 100 parts by mass or less, further preferably 50 parts by mass or less, and particularly preferably 20 parts by mass or less, when the content of the oxidizer is regarded as 100 parts by mass. In addition, the lower limit of the content of the anionic surfactant in the polishing composition is preferably 0.1 part by mass or more, more preferably 0.3 part by mass or more, and further preferably 0.5 part by mass or more, when the content of the oxidizer is regarded as 100 parts by mass. With such a range, while an oxide film having a sufficient thickness is formed, the anionic surfactant is rapidly adsorbed on the surface of the oxide film so that a hydrophobic film can be formed. Therefore, it is possible to improve the polishing speed while etching of the Group III-V compound is suppressed.

[Abrasive Grains]

The abrasive grains contained in the polishing composition of the present invention have an action of mechanically polishing an object to be polished and improve the polishing speed of the object to be polished by the polishing composition.

The abrasive grains may be any of inorganic particles, organic particles, and organic-inorganic composite particles. Examples of the inorganic particles include particles composed of a metal oxide such as silica, alumina, ceria, or titania, silicon nitride particles, silicon carbide particles, and boron nitride particles. Examples of the organic particles include polymethyl methacrylate (PMMA) particles. Of them, silica is preferable, and colloidal silica is particularly preferable. These may be used singly or as a mixture of two or more kinds. Further, as the abrasive grains, a commercially available product or a synthetic product may be used.

The abrasive grains of the present invention may be surface-modified, and in a case where the polishing composition is acidic (for example, in the case of pH 6.0 or less), surface-modified abrasive grains are particularly preferable. The value of the zeta potential of typical colloidal silica is close to zero under an acidic condition, and thus silica particles tend to aggregate without electrically repelling one another under an acidic condition. On the other hand, the abrasive grains which are surface-modified so as to have a relatively large negative zeta potential value even under the acidic condition strongly repel one another even under the acidic condition to be favorably dispersed. As a result, the storage stability of the polishing composition is improved. Such surface-modified abrasive grains can be obtained, for example, by mixing a metal such as aluminum, titanium, or zirconium or an oxide thereof with the abrasive grains and doping on the surface of the abrasive grains. Among them, colloidal silica having an organic acid immobilized is particularly preferable. The immobilization of an organic acid on the surface of colloidal silica to be contained in the polishing composition is performed, for example, by chemically bonding the functional group of the organic acid on the surface of colloidal silica. The immobilization of the organic acid to colloidal silica cannot be accomplished by only allowing colloidal silica to simply coexist with an organic acid. It is possible to perform the immobilization, for example, by the method described in "Sulfonic acid-functionalized silica through quantitative oxidation of thiol groups," Chem. Commun. 246-247 (2003) when sulfonic acid as one kind of organic acids is immobilized on colloidal silica. Specifically, it is possible to obtain colloidal silica having sulfonic acid immobilized on the surface by coupling a silane coupling agent having a thiol group such as 3-mercaptopropyl trimethoxysilane to colloidal silica and then oxidizing the thiol group with hydrogen peroxide. Alternatively, it is possible to perform the immobilization, for example, by the method described in "Novel Silane Coupling Agents Containing a Photolabile 2-Nitrobenzyl Ester for Introduction of a Carboxy Group on the Surface of Silica Gel," Chemistry Letters, 3, 228-229 (2000) when carboxylic acid is immobilized on colloidal silica. Specifically, it is possible to obtain colloidal silica having carboxylic acid immobilized on the surface by coupling a silane coupling agent containing a photoreactive 2-nitrobenzyl ester to colloidal silica and then irradiating with light.

The lower limit of the average primary particle size of the abrasive grains is preferably 1 nm or more, more preferably 3 nm or more, further preferably 5 nm or more, and particularly preferably 10 nm or more. In addition, the upper limit of the average primary particle size of the abrasive grains is preferably 500 nm or less, more preferably 100 nm or less, further preferably 70 nm or less, and particularly preferably 50 nm or less. With such a range, the polishing speed of the object to be polished by the polishing composition is improved, and it is possible to further suppress occurrence of flaws (scratches) caused by polishing on the surface of the object to be polished after the object to be polished is polished using the polishing composition. Incidentally, the average primary particle size of the abrasive grains is calculated, for example, on the basis of the specific surface area of the abrasive grains measured by a BET method.

The upper limit of the average secondary particle size of the abrasive grains is preferably 500 nm or less, more preferably 400 nm or less, further preferably 300 nm or less, and particularly preferably 100 nm or less. In addition, the lower limit of the average secondary particle size of the abrasive grains is preferably 10 nm or more, more preferably 30 nm or more, further preferably 50 nm or more, and particularly preferably 60 nm or more. The value of the average secondary particle size of the abrasive grains can be measured, for example, by a laser light scattering method.

The average association degree of the abrasive grains, which is obtained by dividing the value of the average secondary particle size of the abrasive grains by the value of the average primary particle size, is preferably 1 or more and more preferably 1.2 or more. As the average association degree of the abrasive grains increases, there is an advantage that the removal speed of the object to be polished by the polishing composition is improved. In addition, the average association degree of the abrasive grains is preferably 5 or less, more preferably 4 or less, and further preferably 3 or less. As the average association degree of the abrasive grains decreases, it is easy to obtain a polished surface with less surface defects by polishing the object to be polished using the polishing composition.

The lower limit of the content of the abrasive grains in the polishing composition is preferably 0.01% by mass or more, more preferably 0.05% by mass or more, further preferably 0.1% by mass or more, and particularly preferably 0.5% by mass or more, with respect to the mass of the whole composition. In addition, the upper limit of the content of the abrasive grains in the polishing composition is preferably 50% by mass or less, more preferably 20% by mass or less, further preferably 10% by mass or less, and particularly preferably 5% by mass or less, with respect to the mass of the whole composition. With such a range, the polishing speed of the object to be polished is improved, it is possible to suppress the cost of the polishing composition, and it is possible to further suppress occurrence of level difference defects such as dishing on the surface of the object to be polished after the object to be polished is polished using the polishing composition. Incidentally, in a case where two or more types of abrasive grains are mixed in the polishing composition, the content is the total amount thereof.

[Oxidizer]

The oxidizer contained in the polishing composition of the present invention oxidizes the Group III-V compound contained in the object to be polished to form a brittle oxide film so that polishing efficiency by the abrasive grains is improved.

Examples of the oxidizer that can be used include hydrogen peroxide, peracetic acid, a percarbonate salt, urea peroxide; oxoacid salts of a halogen element such as perchlorate, chlorate, chlorite, and hypochlorite; and persulfate salts such as sodium persulfate, potassium persulfate, and ammonium persulfate. Among them, from the viewpoint of improving the polishing speed (promoting the formation of an oxide film), persulfate salts and hydrogen peroxide are preferable, and from the viewpoint of stability in an aqueous solution and environmental load, hydrogen peroxide is particularly preferable.

The lower limit of the content of the oxidizer in the polishing composition is preferably 0.1 g or more, more preferably 0.2 g or more, and further preferably 0.5 g or more, with respect to 1 kg of the composition. In addition, the upper limit of the content of the oxidizer in the polishing composition is preferably 100 g or less, more preferably 50 g or less, further preferably 30 g or less, and particularly preferably 20 g or less, with respect to 1 kg of the composition. With such a range, it is possible to improve the polishing speed while etching of the Group III-V compound is suppressed. Therefore, it is possible to efficiently process the object to be polished having a layer containing Group III-V compound.

[Dispersing Medium or Solvent]

In the polishing composition, generally, a dispersing medium or solvent for dispersing or dissolving each component is used. Examples of the dispersing medium or the solvent include an organic solvent and water, and of these, water is preferably contained. From the viewpoint of preventing the inhibition of the action of other components, water not containing impurities as much as possible is preferable. Specifically, pure water or ultrapure water in which impurity ions are removed by an ion exchange resin and then foreign matters are removed through a filter, or distilled water is preferable.

[Other Components]

The polishing composition of the present invention may further contain other components such as a metal anticorrosive, an antiseptic agent, an antifungal agent, a salt compound, a water-soluble polymer, and an organic solvent for dissolving a hardly-soluble organic substance, as necessary. Hereinafter, the metal anticorrosive, the antiseptic agent, the antifungal agent, and the salt compound that are preferable other components will be described.

(Metal Anticorrosive)

When a metal anticorrosive is added to the polishing composition, it is possible to further suppress occurrence of a depression beside the wiring by performing polishing using the polishing composition. Further, it is possible to further suppress occurrence of dishing on the surface of the object to be polished after the polishing using the polishing composition.

The metal anticorrosive that can be used is not particularly limited, and is preferably a heterocyclic compound or a surfactant. The number of members of the heterocyclic ring in the heterocyclic compound is not particularly limited. In addition, the heterocyclic compound may be a monocyclic compound or a polycyclic compound having a condensed ring. The metal anticorrosive may be used singly or as a mixture of two or more kinds. Further, as the metal anticorrosive, a commercially available product may be used, or a synthesized product may be used.

Examples of the heterocyclic compound that can be used as the metal anticorrosive include nitrogen-containing heterocyclic compounds such as a pyrrole compound, a pyrazole compound, an imidazole compound, a triazole compound, a tetrazole compound, a pyridine compound, a pyrazine compound, a pyridazine compound, a pyrindine compound, an indolizine compound, an indole compound, an isoindole compound, an indazole compound, a purine compound, a quinolidine compound, a quinoline compound, an isoquinoline compound, a naphthyridine compound, a phthalazine compound, a quinoxaline compound, a quinazoline compound, a cinnoline compound, a pteridine compound, a thiazole compound, an isothiazole compound, an oxazole compound, an isoxazole compound, and a furazan compound.

(Antiseptic Agent and Antifungal Agent)

Examples of the antiseptic agent and the antifungal agent used in the present invention include isothiazolin-based antiseptic agents such as 2-methyl-4-isothiazolin-3-one and 5-chloro-2-methyl-4-isothiazolin-3-one; para-oxybenzoic acid esters; and phenoxyethanol. These antiseptic agents and antifungal agents may be used singly or a mixture of two or more kinds.

(Salt Compound)

Examples of the salt compound used in the present invention include sodium nitrate, potassium nitrate, ammonium nitrate, magnesium nitrate, calcium nitrate, sodium nitrite, potassium nitrite, lithium acetate, sodium acetate, potassium acetate, ammonium acetate, calcium acetate, calcium lactate, lithium benzoate, sodium benzoate, potassium benzoate, lithium carbonate, sodium carbonate, potassium carbonate, magnesium carbonate, calcium carbonate, lithium hydrogen carbonate, sodium hydrogen carbonate, potassium hydrogen carbonate, ammonium carbonate, sodium bicarbonate, sodium sulfate, potassium sulfate, ammonium sulfate, calcium sulfate, magnesium sulfate, sodium sulfite, potassium sulfite, calcium sulfite, magnesium sulfite, potassium thiosulfate, lithium sulfate, magnesium sulfate, sodium thiosulfate, sodium hydrogen sulfite, sodium hydrogen sulfate, potassium hydrogen sulfate, disodium oxalate, dipotassium oxalate, ammonium oxalate, ammonium citrate, disodium glutarate, lithium fluoride, sodium fluoride, potassium fluoride, calcium fluoride, ammonium fluoride, potassium chloride, sodium chloride, ammonium chloride, calcium chloride, potassium bromide, sodium bromide, ammonium bromide, calcium bromide, sodium iodide, potassium iodide, potassium triiodide, calcium iodide, trilithium phosphate, tripotassium phosphate, trisodium phosphate, triammonium phosphate, sodium monohydrogen phosphate, potassium monohydrogen phosphate, sodium dihydrogen phosphate, potassium dihydrogen phosphate, and ammonium dihydrogen phosphate. These salt compounds may be used singly or as a mixture of two or more kinds.

[pH of Polishing Composition]

The upper limit of the pH of the polishing composition is not particularly limited, and is preferably less than 11.0. With such a range, since dissolution of the abrasive grains is inhibited, the stability of the polishing composition is improved. In addition, the lower limit of the pH of the polishing composition is also not particularly limited, and is preferably 2.5 or more. With such a range, the dispersibility of the abrasive grains in the polishing composition is improved. In addition, the upper limit of the pH of the polishing composition is preferably less than 10.0, more preferably 9.1 or less, further preferably 8.0 or less, and particularly preferably 7.0 or less. Further, the lower limit of the pH of the polishing composition is preferably more than 3.0, more preferably 4.0 or more, and further preferably 5.0 or more. With such a range, when polishing is performed at room temperature (25° C.) and/or a high temperature (40° C. or higher), etching of the Group III-V compound is favorably suppressed.

A pH adjusting agent may be used in order to adjust the pH of the polishing composition to a desired value. As the pH adjusting agent, conventionally known acids, bases, or salts thereof can be used. Specific examples of the acids that can be used as the pH adjusting agent include inorganic acids such as hydrochloric acid, sulfuric acid, nitric acid, hydrofluoric acid, boric acid, carbonic acid, hypophosphorous acid, phosphorous acid, and phosphoric acid; and organic acids such as formic acid, acetic acid, propionic acid, butyric acid, pentanoic acid, 2-methylbutyric acid, hexanoic acid, 3,3-dimethylbutyric acid, 2-ethylbutyric acid, 4-methylpentanoic acid, heptanoic acid, 2-methylhexanoic acid, octanoic acid, 2-ethylhexanoic acid, benzoic acid, hydroxyacetic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, diglycolic acid, 2-furan carboxylic acid, 2,5-furan dicarboxylic acid, 3-furan carboxylic acid, 2-tetrahydrofuran carboxylic acid, methoxy acetic acid, methoxy phenyl acetic acid, and phenoxy acetic acid. In a case where an inorganic acid is used as the pH adjusting agent, sulfuric acid, nitric acid, phosphoric acid, and the like are particularly preferable from the viewpoint of improving the polishing speed, and in a case where an organic acid is used as the pH adjusting agent, glycolic acid, succinic acid, maleic acid, citric acid, tartaric acid, malic acid, gluconic acid, itaconic acid, and the like are preferable. In addition, examples of the bases that can be used as the pH adjusting agent include amines such as aliphatic amine and aromatic amine; organic bases such as quaternary ammonium hydroxide; hydroxides of an alkali metal such as potassium hydroxide; hydroxides of a Group 2 element; and ammonia. Among these, from the viewpoint of ease of obtainability, nitric acid, potassium hydroxide, potassium carbonate, phosphoric acid, sulfuric acid, and sodium hydroxide are preferable.

[Method for Producing Polishing Composition]

The method for producing the polishing composition of the present invention is not particularly limited, and for example, the polishing composition can be obtained by stirring and mixing respective components constituting the polishing composition of the present invention in water. Further, a temperature when respective components are mixed is not particularly limited, and is preferably 10° C. or higher and 40° C. or lower, and heating may be carried out in order to increase a rate of dissolution. In addition, a mixing time is also not particularly limited.

[Polishing Method and Method for Manufacturing Semiconductor Substrate]

As described above, the polishing composition of the present invention is suitably used for polishing an object to be polished having a metal wiring layer. Thus, the present invention provides a polishing method of polishing an object to be polished having a layer containing a Group III-V compound by the polishing composition of the present invention. In addition, the object to be polished which is polished using the polishing method is suitably used as a semiconductor substrate. Therefore, the present invention provides a method for manufacturing a semiconductor substrate, including a process of polishing an object to be polished having a Group III-V compound by the polishing method.

As the polishing apparatus, it is possible to use a general polishing apparatus which is equipped with a holder to hold a substrate having an object to be polished and the like, a motor capable of changing the rotation number and the like and has a polishing table capable of being attached with a polishing pad (polishing cloth). As the polishing pad, it is possible to use general nonwoven fabric, polyurethane, a porous fluorine resin, and the like without particular limitation. The polishing pad is preferably subjected to a grooving process so as to store polishing liquid.

Also, there is no particular limitation on the polishing conditions, and for example, the rotational speed of the polishing table is preferably 10 rpm or more and 500 rpm or less, and the pressure applied to the substrate having an object to be polished (polishing pressure) is preferably 0.5 psi or more and 10 psi or less (3.45 kPa or more and 69 kPa or less). The method of supplying the polishing composition to the polishing pad is not also particularly limited, and for example, a method of continuously supplying the polishing composition by a pump or the like is employed. There is no limitation on the supply amount, and it is preferable that the surface of the polishing pad is covered with the polishing composition of the present invention at all times.

After the polishing is completed, the substrate is washed with running water and the water droplets attached on the substrate are shaken off and dried by a spin dryer or the like, thereby obtaining a substrate having a metal wiring layer and a barrier layer.

The polishing composition according to the present invention may be one-component type or multi-component type including two-component type in which some or whole of polishing compositions are mixed at an arbitrary mixing ratio. In addition, in a case where a polishing apparatus having a plurality of supply passages for the polishing composition is used, two or more polishing compositions which have been adjusted in advance may be used such that the polishing compositions are mixed in the polishing apparatus.

Further, the polishing composition according to the present invention may be prepared by diluting a stock solution of the polishing composition with water. In a case where the polishing composition is two-composition type, the order of mixing and diluting both of the compositions may be changed arbitrarily. For example, one composition may be diluted with water, followed by mixing the dilution with the other composition, both of the compositions may be mixed together and diluted with water simultaneously, or alternatively, both of the compositions may be mixed together, followed by diluting the mixed polishing composition with water.

EXAMPLES

The present invention will be described in more detail using the following Examples and Comparative Examples. However, the technical scope of the present invention is not limited to only the following Examples.

Examples 1 to 17 and Comparative Examples 1 to 5

The following abrasive grains and surfactant were added such that the content thereof became the content presented in the following Table 2 with respect to the whole polishing composition. In addition, an aqueous solution of hydrogen peroxide (31% by mass) was added as the oxidizer such that the addition amount thereof became the addition amount presented in the following Table 2 with respect to 1 kg of the polishing composition and stirred and mixed in water set to 25° C. to prepare polishing compositions of Examples 1 to 13 and Comparative Examples 1 to 5. The pH of the polishing composition was adjusted by adding potassium hydroxide (KOH) or nitric acid ($HNO_3$) and confirmed by a pH meter.

Incidentally, as the abrasive grains, the following abrasive grains were used;

Abrasive grains 1: colloidal silica which is not surface-modified (average primary particle size: 30 nm, average secondary particle size: 70 nm)

Abrasive grains 2: colloidal silica having a sulfonic group immobilized on the surface (average primary particle size: 30 nm, average secondary particle size: 70 nm)

Further, as the surfactant, the following surfactant was used;

A: polyoxyethylene alkyl ether phosphoric acid (average EO addition mole number=3, linear alkyl having a carbon number of 12 or more and 15 or less)

B: dipolyoxyethylene alkyl ether phosphoric acid (average EO addition mole number=2, linear alkyl having a carbon number of 12 or more and 15 or less)

C: polyoxyethylene aryl phenyl ether phosphate triethanolamine salt (manufactured by TAKEMOTO OIL & FAT Co., Ltd., NEWKALGEN FS-3AQ)

D: potassium laurate

E: polyoxyethylene lauryl ether acetic acid (average EO addition mole number=3)

F: polyoxyethylene lauryl ether acetic acid (average EO addition mole number=5)

G: polyoxyethylene lauryl ether acetic acid (average EO addition mole number=10)

H: lauryl phosphate

I: sodium dodecyl diphenyl ether disulfonate

J: dodecylbenzene sulfonic acid

K: polyoxyethylene alkyl ether (manufactured by DKS Co. Ltd., NOIGEN (registered trademark) ET-95)

L: polyoxyethylene sorbitan oleate ester (manufactured by TAKEMOTO OIL & FAT Co., Ltd., PIONIN D-945)

M: didecyl methyl polyoxyethyl ammonium propionate (manufactured by TAKEMOTO OIL & FAT Co., Ltd., PIONIN B-0012-H)

[Polishing Speed]

Regarding a GaAs substrate, the polishing speed obtained when the GaAs substrate was polished for a certain time under the polishing conditions presented in the following Table 1 using each of the polishing compositions of Examples 1 to 17 and Comparative Examples 1 to 5 was determined. As the GaAs substrate, a GaAs substrate was used after being processed into the form of a coupon having a size of 3 cm×3 cm.

Regarding the polishing speed of the GaAs substrate, the polished amount was calculated from a change in mass before and after polishing, and the polishing speed of the GaAs substrate was measured by dividing the polished amount by the polishing time and the specific gravity of GaAs.

TABLE 1

| <Polishing Conditions> |
| --- |
| Polishing apparatus: CMP single-sided polishing machine (ENGIS) |
| Polishing pad: Pad made of polyurethane IC-1010 |
| Polishing pressure: 1.5 psi (about 10.3 kpa) |
| Speed of rotation of polishing table: 60 rpm |
| Speed of rotation of carrier: 40 rpm |
| Flow rate of polishing composition: 100 ml/min |
| Polishing time: 300 sec |

[Rate of Dissolution]

Regarding the rate of dissolution of the GaAs substrate, a GaAs substrate having a size of 3 cm×3 cm was immersed for 20 minutes at 25° C. or 43° C. in a polishing composition that was rotated at 300 rpm using a stirring bar.

Regarding the rate of dissolution of the GaAs substrate, the dissolved amount was calculated from a change in mass before and after immersion, and the rate of dissolution of the GaAs substrate was measured by dividing the dissolved amount by the immersion time and the specific gravity of GaAs.

TABLE 2

| | Abrasive grains | | Oxidizer | | Surfactant | | | | | Polishing speed | Rate of dissolution (Å/min) | |
|---|---|---|---|---|---|---|---|---|---|---|---|---|
| | Type | Concentration (% by mass) | Type | Addition amount (g/kg) | Type | Classification | Hydrophilic group | Concentration (ppm) | pH | (Å/min) | 25° C. | 43° C. |
| Comparative Example 1 | Abrasive grains 1 | 1.0 | — | — | — | — | — | — | 7.0 | 50 | 0 | 0 |
| Comparative Example 2 | Abrasive grains 1 | 1.0 | H₂O₂ | 5.5 | — | — | — | — | 7.0 | 700 | 18 | 33 |
| Example 1 | Abrasive grains 1 | 1.0 | H₂O₂ | 5.5 | A | Anionic | Phosphoric acid | 270 | 7.0 | 220 | 0 | 1 |
| Example 2 | Abrasive grains 1 | 1.0 | H₂O₂ | 5.5 | B | Anionic | Phosphoric acid | 270 | 7.0 | 240 | 0 | 1 |
| Example 3 | Abrasive grains 1 | 1.0 | H₂O₂ | 5.5 | C | Anionic | Phosphoric acid | 270 | 7.0 | 267 | 0 | 2 |
| Example 4 | Abrasive grains 1 | 1.0 | H₂O₂ | 5.5 | D | Anionic | Carboxylic acid | 270 | 7.0 | 209 | 0 | 2 |
| Example 5 | Abrasive grains 1 | 1.0 | H₂O₂ | 5.5 | E | Anionic | Carboxylic acid | 150 | 7.0 | 224 | 0 | 1 |
| Example 6 | Abrasive grains 1 | 1.0 | H₂O₂ | 11.0 | E | Anionic | Carboxylic acid | 150 | 7.0 | 378 | 0 | 1 |
| Example 7 | Abrasive grains 1 | 1.0 | H₂O₂ | 22.0 | E | Anionic | Carboxylic acid | 150 | 7.0 | 635 | 0 | 1 |
| Example 8 | Abrasive grains 1 | 1.0 | H₂O₂ | 22.0 | F | Anionic | Carboxylic acid | 300 | 7.0 | 450 | 0 | 2 |
| Example 9 | Abrasive grains 1 | 1.0 | H₂O₂ | 22.0 | G | Anionic | Carboxylic acid | 300 | 7.0 | 402 | 0 | 4 |
| Example 10 | Abrasive grains 1 | 1.0 | H₂O₂ | 22.0 | H | Anionic | Phosphoric acid | 300 | 7.0 | 332 | 0 | 1 |
| Example 11 | Abrasive grains 1 | 1.0 | H₂O₂ | 55.0 | E | Anionic | Carboxylic acid | 150 | 7.0 | 592 | 0 | 2 |
| Example 12 | Abrasive grains 2 | 1.0 | H₂O₂ | 5.5 | E | Anionic | Carboxylic acid | 150 | 3.0 | 172 | 0 | 5 |
| Example 13 | Abrasive grains 2 | 1.0 | H₂O₂ | 5.5 | E | Anionic | Carboxylic acid | 150 | 5.0 | 169 | 0 | 1 |
| Example 14 | Abrasive grains 2 | 1.0 | H₂O₂ | 5.5 | E | Anionic | Carboxylic acid | 150 | 7.0 | 238 | 0 | 1 |
| Example 15 | Abrasive grains 2 | 1.0 | H₂O₂ | 5.5 | E | Anionic | Carboxylic acid | 300 | 9.1 | 298 | 0 | 2 |
| Example 16 | Abrasive grains 1 | 1.0 | H₂O₂ | 5.5 | I | Anionic | Carboxylic acid | 270 | 7.0 | 500 | 2 | 16 |
| Example 17 | Abrasive grains 1 | 1.0 | H₂O₂ | 5.5 | J | Anionic | Carboxylic acid | 270 | 7.0 | 470 | 1 | 12 |
| Comparative Example 3 | Abrasive grains 1 | 1.0 | H₂O₂ | 5.5 | K | Nonionic | Polyoxyethylene | 100 | 7.0 | 659 | 16 | 31 |
| Comparative Example 4 | Abrasive grains 1 | 1.0 | H₂O₂ | 5.5 | L | Nonionic | Sorbitan | 100 | 7.0 | 580 | 13 | 30 |
| Comparative Example 5 | Abrasive grains 1 | 1.0 | H₂O₂ | 5.5 | M | Cationic | Ammonium salt | 100 | 7.0 | *1 | 10 | 25 |

*Polishing is not performed since the abrasive grains aggregate.

From the results of Table 2, it was found out that the polishing compositions according to Examples 1 to 17 improved the polishing speed while suppressing etching of GaAs. It is shown that the polishing composition according to the present invention can efficiently polish the object to be polished having a layer containing a Group III-V compound.

Incidentally, the present application is based on Japanese Patent Application No. 2016-061571 filed on Mar. 25, 2016, and a disclosed content thereof is incorporated herein as a whole by reference.

The invention claimed is:

1. A polishing composition used for polishing an object to be polished having a layer containing a Group III-V compound, the polishing composition comprising:
    abrasive grains;
    an oxidizer; and
    an anionic surfactant,
    wherein an average association degree of the abrasive grains, which is obtained by dividing a value of an average secondary particle size of the abrasive grains by a value of an average primary particle size of the abrasive grains, is 70/30 or more and 5 or less, and
    the anionic surfactant contains a polyoxyethylene group and the polyoxyethylene group is a group represented by $-(AO)_n-$, wherein A is a non-substituted ethylene group and n represents an average addition mole number of the oxyethylene group and is 1 or more and 50 or less, and
    the anionic surfactant is at least one kind selected from the group consisting of a polyoxyethylene alkyl ether phosphoric acid wherein the alkyl is linear alkyl having a carbon number of 12 or more and 15 or less, dipolyoxyethylene alkyl ether phosphoric acid wherein the alkyl is linear alkyl having a carbon number of 12 or more and 15 or less, polyoxyethylene aryl phenyl ether phosphate triethanolamine salt, or polyoxyethylene lauryl ether acetic acid.

2. The polishing composition according to claim 1, wherein the Group III-V compound is at least one kind selected from the group consisting of GaAs, InP, InAs, AlAs, InGaAs, InGaAsP, AlGaAs, and InAlGaAs.

3. The polishing composition according to claim 1, wherein the A is a substituted or non-substituted ethylene group and the n is 2 or more and 10 or less.

4. A polishing method of polishing an object to be polished having a layer containing a Group III-V compound by the polishing composition according to claim 1.

5. A method for manufacturing a semiconductor substrate, comprising a process of polishing an object to be polished having a layer containing a Group III-V compound by the polishing method according to claim 4.

6. The polishing composition according to claim 1, wherein the polishing composition further comprises a pH adjusting agent.

7. The polishing composition according to claim 6, wherein the polishing composition consists of:
    the abrasive grains;
    the oxidizer;
    the anionic surfactant;
    the pH adjusting agent; and
    water.

8. The polishing composition according to claim 1, wherein the polishing composition has a pH of 2.5 or more and less than 11.0.

9. The polishing composition according to claim 1, wherein the average association degree of the abrasive grains is 4 or less.

* * * * *